US010947638B2

(12) United States Patent
Hirao et al.

(10) Patent No.: US 10,947,638 B2
(45) Date of Patent: Mar. 16, 2021

(54) UNDERLYING SUBSTRATE INCLUDING A SEED CRYSTAL LAYER OF A GROUP 13 NITRIDE HAVING STRIPE-SHAPED PROJECTIONS AND RECESSES AND AN OFF-ANGLE IN A DIRECTION OF AN A-AXIS

(71) Applicant: NGK INSULATORS, LTD., Nagoya (JP)

(72) Inventors: Takayuki Hirao, Nisshin (JP); Makoto Iwai, Kasugai (JP); Katsuhiro Imai, Nagoya (JP); Takashi Yoshino, Ama (JP)

(73) Assignee: NGK INSULATORS, LTD.

( * ) Notice: Subject to any disclaimer, the term of this patent is extended or adjusted under 35 U.S.C. 154(b) by 37 days.

(21) Appl. No.: 15/920,905

(22) Filed: Mar. 14, 2018

(65) Prior Publication Data

US 2018/0202067 A1 Jul. 19, 2018

Related U.S. Application Data

(63) Continuation of application No. PCT/JP2016/079009, filed on Sep. 30, 2016.

(30) Foreign Application Priority Data

Oct. 20, 2015 (JP) .............................. JP2015-206078

(51) Int. Cl.
*C30B 19/12* (2006.01)
*C30B 9/10* (2006.01)
(Continued)

(52) U.S. Cl.
CPC ................ *C30B 19/12* (2013.01); *C30B 9/10* (2013.01); *C30B 19/02* (2013.01); *C30B 25/18* (2013.01);
(Continued)

(58) Field of Classification Search
CPC .... C30B 9/00; C30B 9/04; C30B 9/08; C30B 9/10; C30B 9/12; C30B 19/00;
(Continued)

(56) References Cited

U.S. PATENT DOCUMENTS

2006/0084245 A1* 4/2006 Kohda .................. H01L 33/007
438/478
2010/0240161 A1* 9/2010 Kamikawa ........ H01L 21/02642
438/46
(Continued)

FOREIGN PATENT DOCUMENTS

JP 2010024090 A 2/2010
JP 2010163288 A 7/2010
(Continued)

OTHER PUBLICATIONS

International Preliminary Report on Patentability for PCT/JP2016/079009, dated Apr. 24, 2018 (1 pg).
(Continued)

*Primary Examiner* — Kenneth A Bratland, Jr.
(74) *Attorney, Agent, or Firm* — Flynn Thiel, P.C.

(57) ABSTRACT

An underlying substrate including a seed crystal layer of a group 13 nitride, wherein projections and recesses repeatedly appear in stripe shapes at a principal surface of the seed
(Continued)

crystal layer, and the projections have a level difference of 0.3 to 40 μm and a width of 5 to 100 μm, and the recesses have a bottom thickness of 2 μm or more and a width of 50 to 500 μm.

5 Claims, 5 Drawing Sheets

(51) Int. Cl.
H01L 21/02 (2006.01)
C30B 19/02 (2006.01)
C30B 25/18 (2006.01)
C30B 29/40 (2006.01)
C30B 33/12 (2006.01)

(52) U.S. Cl.
CPC ............ C30B 29/406 (2013.01); C30B 33/12 (2013.01); H01L 21/0242 (2013.01); H01L 21/0243 (2013.01); H01L 21/0254 (2013.01); H01L 21/02389 (2013.01); H01L 21/02433 (2013.01); H01L 21/02458 (2013.01); H01L 21/02513 (2013.01); H01L 21/02516 (2013.01); H01L 21/02631 (2013.01); H01L 21/02634 (2013.01)

(58) Field of Classification Search
CPC ......... C30B 19/02; C30B 19/12; C30B 25/00; C30B 25/02; C30B 25/18; C30B 33/00; C30B 33/12; C39B 29/00; C39B 29/10; C39B 29/40; C39B 29/403; C39B 29/406; H01L 21/02389; H01L 21/0242; H01L 21/0243; H01L 21/02433; H01L 21/02458; H01L 21/02513; H01L 21/02516; H01L 21/0254; H01L 21/02631; H01L 21/02634
USPC ... 117/11, 54, 58, 63–65, 67, 73, 77–79, 84, 117/88, 94, 101, 106, 937, 952
See application file for complete search history.

(56) References Cited

U.S. PATENT DOCUMENTS

| 2012/0175740 | A1 | 7/2012 | Hirao et al. |
| 2013/0199438 | A1* | 8/2013 | Nagai ........................ C30B 9/06 117/58 |
| 2014/0026809 | A1 | 1/2014 | Iwai et al. |
| 2014/0077223 | A1* | 3/2014 | Choe ........................ H01L 21/20 257/76 |

FOREIGN PATENT DOCUMENTS

| JP | 2012/121769 A | 6/2012 |
| JP | 2012-126602 A | 7/2012 |
| JP | 2013-063908 A | 4/2013 |
| JP | 2013-193915 A | 9/2013 |
| JP | 2014-055091 A | 3/2014 |
| JP | 2015-057368 A | 3/2015 |
| WO | WO 2011/046203 A1 | 4/2011 |
| WO | WO 2012/128378 A1 | 9/2012 |

OTHER PUBLICATIONS

English translation of Written Opinion of the International Searching Authority for PCT/JP2016/079009, dated Nov. 29, 2016 (5 pgs).
Search Report of European Patent Office issued in European Application No. EP 16857249, in English, dated Apr. 25, 2019.
International Search Report for corresponding application No. PCT/JP2016/079009, dated Nov. 29, 2016 (2 pgs.).
Japanese Language Written Opinion for corresponding application No. PCT/JP2016/079009, dated Nov. 29, 2016 (4 pgs.).
European Search Report for corresponding application No. 16 857 249.3, dated Dec. 11, 2019 (6 pages).
China Office Action for corresponding application No. 201680052907.X, dated Nov. 4, 2019, with English translation thereof (12 pages).
Japanese Office Action with English translation issued from the Japanese Patent Office for corresponding Japanese Application No. 2017-546474, dated Apr. 28, 2020 (11 pages).

* cited by examiner

UNDERLYING SUBSTRATE INCLUDING A SEED CRYSTAL LAYER OF A GROUP 13 NITRIDE HAVING STRIPE-SHAPED PROJECTIONS AND RECESSES AND AN OFF-ANGLE IN A DIRECTION OF AN A-AXIS

CROSS-REFERENCE TO RELATED APPLICATIONS

This application is a continuation application of PCT/JP2016/079009, filed Sep. 30, 2016, which claims priority to Japanese Patent Application No. 2015-206078, filed Oct. 20, 2015, the entire contents all of which are incorporated herein by reference.

BACKGROUND OF THE INVENTION

1. Field of the Invention

The present invention relates to an underlying substrate, a method of manufacturing the underlying substrate, and a method of producing a group 13 nitride crystal.

2. Description of the Related Art

As an example of an underlying substrate used in producing a group 13 nitride crystal, represented by a gallium nitride crystal, by a flux method, there is known an underlying substrate in which micro-steps are formed in a stair-like shape on a principal surface of a seed crystal layer of the underlying substrate (see Patent Literature (PTL) 1). Procedures for growing a GaN crystal with use of the above-mentioned underlying substrate are as follows. The underlying substrate including a seed crystal layer of GaN is immersed in a mixed melt containing metallic gallium and metallic sodium, thus causing the GaN crystal to grow on the principal surface of the underlying substrate while nitrogen gas is introduced to the mixed melt. In a growing process of the GaN crystal on the principal surface, a grain boundary is generated obliquely upward starting from a point near each step that provides a level difference. On the other hand, a dislocation involved in the seed crystal layer propagates in a direction intersecting an advancing direction of the grain boundary, and the propagation of the dislocation is stopped by the grain boundary at a point where the dislocation and the grain boundary intersect each other. Accordingly, defects attributable to dislocations are hardly present in an upper layer portion of the GaN crystal that has been produced by the flux method with the use of the above-described underlying substrate.

CITATION LIST

Patent Literature

PTL 1: WO 2011/046203

SUMMARY OF THE INVENTION

However, the above-described underlying substrate has a problem in that a seed crystal layer having a certain thickness is required because the micro-steps are formed in the stair-like shape.

The present invention has been accomplished to solve the above problem, and a main object of the present invention is to provide an underlying substrate with which a group 13 nitride crystal involving fewer defects attributable to dislocations can be produced by the flux method, even when the thickness of the seed crystal layer is reduced.

To achieve the above main object, the present invention is constituted as follows.

The present invention provides an underlying substrate including a seed crystal layer of a group 13 nitride, wherein projections and recesses repeatedly appear in stripe shapes at a principal surface of the seed crystal layer, and the projections have a level difference of 0.3 to 40 μm and a width of 5 to 100 μm, and the recesses have a bottom thickness of 2 μm or more and a width of 50 to 500 μm.

The above-described underlying substrate is used in the flux method, by way of example, as follows. A group 13 nitride crystal is grown on the principal surface of the seed crystal layer by placing the underlying substrate in a vessel together with a group 13 metal and a flux, and by heating the vessel while nitrogen gas is introduced to the vessel. On the seed crystal layer, one projection is present between two recesses. When the group 13 nitride crystal continues to grow on the seed crystal layer, a grain boundary continues to extend, starting from near one edge of the projection, obliquely upward so as to cover one of the two recesses. Furthermore, another grain boundary continues to extend, starting from near the other edge of the same projection, obliquely upward so as to cover the other of the two recesses. Those extensions of the grain boundaries occur for each of the projections. The grain boundaries generated from the adjacent projections collide with each other in the course of extending. Although the grain boundaries generating from the projections continue to grow while involving inclusions, voids (involving the inclusions) are formed and the inclusions unspread at points where the grain boundaries collide with each other. Therefore, the group 13 nitride crystal involving no (or substantially no) inclusions grows in an upper layer portion above the points where the grain boundaries collide with each other. Moreover, many voids formed at the points where the grain boundaries collide with each other serve to relax the thermal stress caused by a difference in thermal expansion between the seed crystal layer of the underlying substrate and the remaining layer thereof except for the seed crystal layer. Thus, the presence of the voids suppresses cracks from being generated in the grown group 13 nitride. On the other hand, dislocations involved in the seed crystal layer propagate in a direction that intersects advancing directions of the grain boundaries, and the propagation of the dislocations is stopped by the grain boundaries at the points where the grain boundaries and the dislocations intersect each other. Hence the dislocations do not propagate beyond the grain boundaries. As a result, an upper layer portion of the grown group 13 nitride crystal above the voids has a high quality with fewer amounts of the inclusions, cracks, and dislocations. Thus, a group 13 nitride crystal having a high quality can be obtained by removing a lower layer portion (including the seed crystal layer) of the grown group 13 nitride crystal under the voids by polishing, for example. With the underlying substrate according to the present invention, as described above, since the seed crystal layer has the structure including the projections and the recesses, which are repeatedly present in the stripe shapes, instead of the steps in the stair-like shape as in the related art, a group 13 nitride crystal having a high quality can be produced by the flux method, even when the thickness of the seed crystal layer is reduced.

Preferably, the level difference of the projections is 0.3 to 40 μm, and the width of the projections is 5 to 100 μm. If the level difference of the projections is smaller than 0.3 μm, a dislocation density is not entirely reduced because the grain boundaries are not generated in the group 13 nitride crystal obtained with the flux method, and a stress relaxation effect is not obtained because the voids were also not generated, whereby the crystal is fractured in some cases. If the level difference of the projections is greater than 40 μm, the voids remain in the upper layer portion of the group 13 nitride crystal obtained with the flux method, and the crystal is fractured starting from those voids in some cases. If the width of the projections is smaller than 5 μm, the dislocation density is entirely not reduced because the projections disappear due to melt-back in the middle of processing of the flux method and the grain boundaries were not generated, and the stress relaxation effect is not obtained because the voids are also not generated, whereby the crystal is fractured in some cases. If the width of the projections is greater than 100 μm, the dislocation density is not reduced in regions of the group 13 nitride crystal obtained with the flux method, the regions being positioned above the projections, and the stress relaxation effect is insufficient because a distribution density of the voids is low, whereby the crystal is fractured in some cases.

Preferably, the bottom thickness of the recesses is 2 μm or more, and the width of the recesses is 50 to 500 Ξm. If the bottom thickness of the recesses is smaller than 2 μm, the seed crystal layer disappears due to melt-back in the middle of the processing, and hence the group 13 nitride crystal is not grown. Although an upper limit of the bottom thickness of the recesses is not limited to a particular value, it is proved that the advantageous effects of the present invention can be obtained at the bottom thickness within a range up to at least 40 μm. If the width of the recesses is smaller than 50 μm, the voids were not generated well, and void sizes are relatively large even when the voids are generated. Hence the crystal is fractured and many inclusions remain in the upper layer portion in some cases. If the width of the recesses is greater than 500 μm, the distribution density of the voids is reduced, and the void sizes are increased. Hence the crystal is fractured and many inclusions remain in the upper layer portion in some cases.

Examples of the group 13 nitride include boron nitride (BN), aluminum nitride (AlN), gallium nitride (GaN), indium nitride (InN), thallium nitride (TlN), and so on. Among those examples, GaN is preferable. The underlying substrate may be, for example, a substrate in which a thin film of the same type material as the group 13 nitride is formed as the seed crystal layer on a surface of a sapphire substrate, a silicon carbide substrate, a silicon substrate, for example, or may be a substrate of the same type material as the group 13 nitride. However, the sapphire substrate is preferable. The flux may be selected as appropriate from a variety of metals depending on the type of the group 13 metal. When the group 13 metal is gallium, for example, an alkali metal is preferable, and metallic sodium or metallic potassium is more preferable. Metallic sodium is even more preferable. The term "inclusion" implies a substance mainly resulting from solidification of a mixed melt (i.e., a melt of the group 13 metal and the flux) that has been involved in the group 13 nitride crystal.

In the underlying substrate according to the present invention, preferably, the level difference of the projections is 0.5 to 10 μm, the width of the projections is 10 to 50 μm, and the width of the recesses is 100 to 250 μm. Under those conditions, the upper layer portion (above the voids) of the group 13 nitride crystal obtained by the flux method with the use of the above-described underlying substrate has a higher quality.

In the underlying substrate according to the present invention, preferably, the edges of the projections are parallel to an a-plane of the group 13 nitride crystal. When the edges of the projections are parallel to the a-plane of the group 13 nitride crystal, an angle formed by each of the grain boundaries relative to a c-plane is smaller than that in the case where the edges of the projections are parallel to an m-plane, and therefore a position of the void formed by the adjacent grain boundaries colliding with each other is lowered. As a result, a thickness of a portion of the grown group 13 nitride crystal, the portion to be discarded, is reduced, and the yield is increased. Here, the expression "parallel to the a-plane" includes not only the case where the projection edges are perfectly parallel to the a-plane, but also the case where the projection edges are substantially parallel to the a-plane (e.g., a direction forming an angle of smaller than 5° relative to the a-plane).

In the underlying substrate according to the present invention, preferably, an off-angle of the seed crystal layer is 0.24 to 2.4° in a direction of an a-axis of the group 13 nitride crystal. On the condition of the off-angle being within the above range, even though the cracks are partly present in the upper layer portion of the group 13 nitride crystal obtained with the flux method, a group 13 nitride crystal having a sufficiently high quality can be obtained except for points where the cracks are present. The off-angle is preferably 0.36 to 1.2° in the direction of the a-axis of the group 13 nitride crystal. On the condition of the off-angle being within the above range, a group 13 nitride crystal including no (or substantially no) cracks is obtained.

The present invention further provides a method of manufacturing any one of the above-described underlying substrates, wherein the underlying substrate is obtained by epitaxially growing a group 13 nitride crystal into a film on a sapphire substrate with a gas-phase method, the group 13 nitride crystal constituting the seed crystal layer, and by patterning a principal surface of the seed crystal layer such that projections and recesses repeatedly appear in stripe shapes at the principal surface.

With that manufacturing method, the above-described underlying substrate can be manufactured comparatively easily. A method of patterning the principal surface of the seed crystal layer may be, for example, dry etching, wet etching, laser processing, sand blasting, EB vapor deposition, or dicing, though not limited thereto. Among those examples, dry etching is preferable.

The present invention still further provides a method of producing a group 13 nitride crystal, wherein the group 13 nitride crystal is grown on the seed crystal layer by placing any one of the above-described underlying substrates in a vessel together with a group 13 metal and metallic sodium, and by heating the vessel to 700 to 1000° C. while nitrogen is introduced to the vessel.

With the above production method, a group 13 nitride crystal having a high quality can be obtained. To explain in more detail, on the seed crystal layer, one projection is present between two recesses. When the group 13 nitride crystal continues to grow on the seed crystal layer, a grain boundary continues to extend, starting from near one edge of the projection, obliquely upward so as to cover one of the two recesses. Furthermore, another grain boundary continues to extend, starting from near the other edge of the same projection, obliquely upward so as to cover the other of the two recesses. Those extensions of the grain boundaries occur for each of the projections. The grain boundaries generated from the adjacent projections collide with each other in the course of the extensions. Although the grain boundaries generated from the projections continue to grow while involving inclusions, voids (involving the inclusions) are formed and the inclusions unspread at points where the grain boundaries collide with each other. Therefore, the group 13 nitride crystal involving no (or substantially no) inclusions grows in an upper layer portion above the points where the grain boundaries collide with each other. Moreover, many voids formed at the points where the grain boundaries collide with each other serve to relax the thermal stress caused by a difference in thermal expansion between the seed crystal layer of the underlying substrate and the remaining layer thereof except for the seed crystal layer. Thus, the presence of the voids suppresses cracks from being generated in the grown group 13 nitride. On the other hand, dislocations involved in the seed crystal layer propagate in a direction that intersects advancing directions of the grain boundaries, and the propagation of the dislocations is stopped by the grain boundaries at the points where the grain boundaries and the dislocations intersect each other. Hence the dislocations do not propagate beyond the grain boundaries. As a result, an upper layer portion of the grown group 13 nitride crystal above the voids has a high quality with fewer amounts of the inclusions, cracks, and dislocations. Thus, the group 13 nitride crystal having a high quality can be obtained by removing a lower layer portion (including the seed crystal layer) of the grown group 13 nitride crystal under the voids by polishing, for example. With the method of producing the group 13 nitride crystal according to the present invention, as described above, a group 13 nitride crystal having a high quality can be obtained even when the thickness of the seed crystal layer of the underlying substrate is reduced.

In the group 13 nitride crystal obtained with the above production method, the dislocation density is preferably $1\times10^6/cm^2$ or less and more preferably less than $1\times10^4/cm^2$.

DETAILED DESCRIPTION OF THE INVENTION

Figure 1:
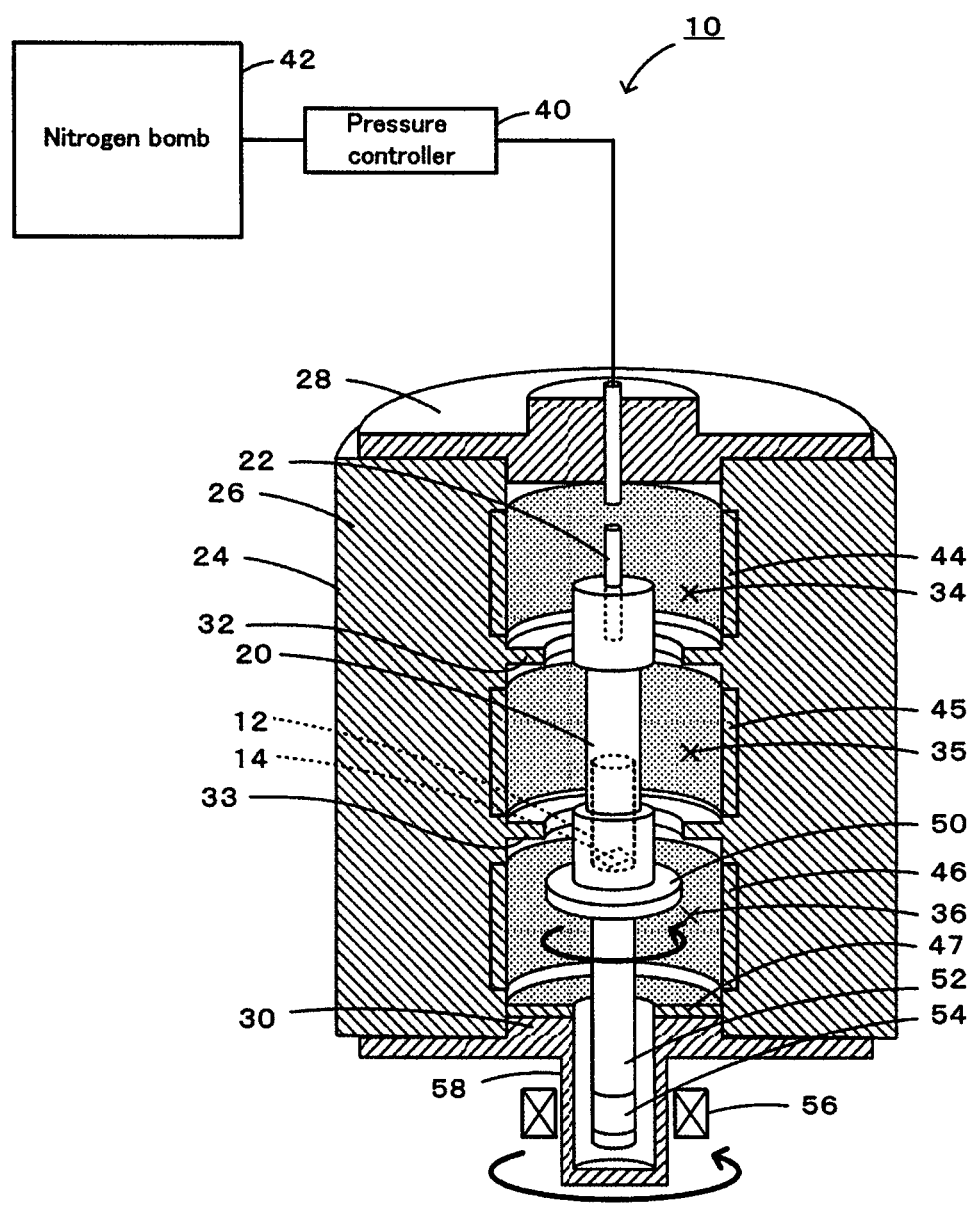
FIG. 1 is an explanatory view illustrating an overall configuration of a crystal production apparatus 10.
Figure 2:
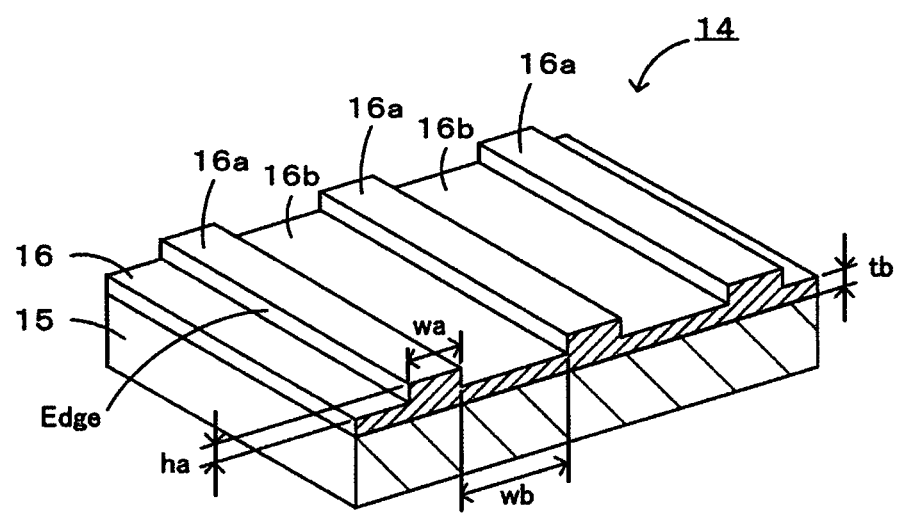
FIG. 2 is a perspective view of an underlying substrate 14.
Figure 3:
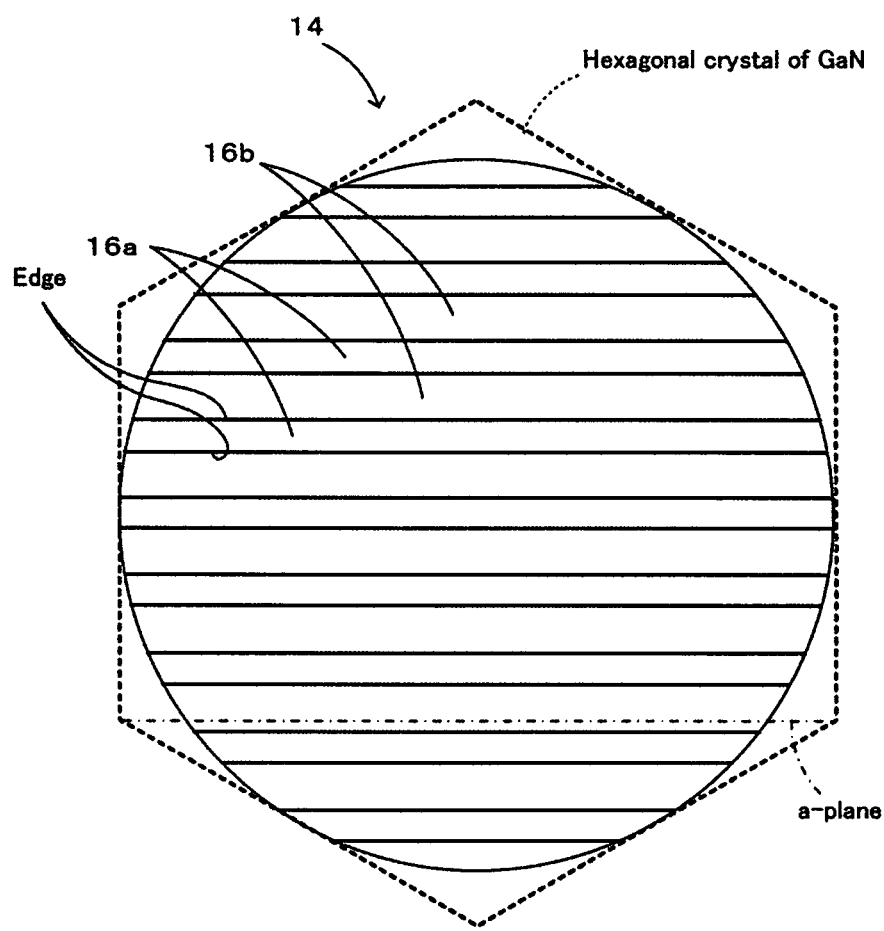
FIG. 3 is a plan view of the underlying substrate 14.

An apparatus suitable for carrying out a method of growing a group 13 nitride crystal according to the present invention will be described below with reference to the drawings. FIG. 1 is an explanatory view illustrating an overall configuration of a crystal production apparatus 10. FIG. 2 is a perspective view of an underlying substrate 14. FIG. 3 is a plan view of the underlying substrate 14. The following description is made in connection with an example of producing GaN as the group 13 nitride crystal.

As illustrated in FIG. 1, the crystal production apparatus 10 includes a growing vessel 12, the underlying substrate 14 placed in the growing vessel 12, a reaction vessel 20 containing the growing vessel 12, an electric furnace 24 in which the reaction vessel 20 is arranged, and a pressure controller 40 disposed between a nitrogen bomb 42 and the electric furnace 24.

The growing vessel 12 is an alumina-made crucible having a cylindrical shape and equipped with a bottom. The underlying substrate 14 is placed in the growing vessel 12. Furthermore, metallic gallium and flux are put into the growing vessel 12. The flux is preferably metallic sodium. The metallic gallium and the flux become a mixed melt when heated.

As illustrated in FIG. 2, the underlying substrate 14 is obtained by epitaxially growing GaN into a film having a predetermined thickness (e.g., about several μm) on a sapphire substrate 15 with a gas-phase method, thus forming a seed crystal layer 16, and then forming projections 16a and recesses 16b to be alternately positioned in stripe shapes at a principal surface of the seed crystal layer 16. Each of the projections 16a has a level difference ha of 0.3 to 40 μm (preferably 0.5 to 10 μm) and a width wa of 5 to 10 μm (preferably 10 to 50 μm), and each of the recesses 16b has a bottom thickness tb of 2 μm or more and a width wb of 50 to 500 μm (preferably 100 to 250 μm). Moreover, as illustrated in FIG. 3, an edge of the projection 16a is formed parallel to an a-plane of a hexagonal crystal of GaN. Processing of the principal surface of the seed crystal layer 16 into the above-described shape can be implemented, for example, by dry etching, sand blasting, laser processing, or dicing. In an example, after covering regions of the principal surface corresponding to the projections 16a with a mask, surfaces of regions not covered with the mask are etched by dry etching. As a result, the regions etched by the dry etching define the recesses 16b, and the regions covered with the mask define the projections 16a. It is known that a relational expression of $\theta g \approx 1.2 \theta s$ holds between an off-angle $\theta s$ formed by a normal line of the principal surface and a c-axis of the sapphire substrate and an off-angle $\theta g$ formed by the normal line of the principal surface and a c-axis of the seed crystal layer of GaN. The off-angle $\theta s$ is preferably 0.2 to 2° and more preferably 0.3 to 1° in an m-axis direction of sapphire (i.e., an a-axis direction of GaN). Looking at those conditions in terms of the off-angle $\theta g$ on the basis of the above-described relational expression, the off-angle $\theta g$ is preferably 0.24 to 2.4° and more preferably 0.36 to 1.2° in the a-axis direction of GaN.

The reaction vessel 20 is made of stainless steel and is placed on a disk-shaped rotating table 50 with a rotating shaft 52 attached to a lower surface of the rotating table 50. The rotating shaft 52 includes an inner magnet 54 and is rotated when an outer magnet 56 is rotated by an external motor (not illustrated), the outer magnet 56 being arranged in the form of a ring outside a cylindrical casing 58. An inlet pipe 22 inserted into the reaction vessel 20 is cut at a position within an upper zone 34. Accordingly, when the rotating shaft 52 is rotated, the reaction vessel 20 placed on the rotating table 50 is also rotated smoothly. Moreover, nitrogen gas is fully filled into the electric furnace 24 from the nitrogen bomb 42 through the pressure controller 40, and is then introduced into the reaction vessel 20 through the inlet pipe 22.

The electric furnace 24 includes a hollow circular cylindrical body 26 in which the reaction vessel 20 is arranged, and an upper cover 28 and a lower cover 30 covering respectively an upper opening and a lower opening of the circular cylindrical body 26. The electric furnace 24 is of the 3-zone heater type and divided into three zones, i.e., the upper zone 34, a middle zone 35, and a lower zone 36, by two ring-shaped partition plates 32 and 33 that are provided on an inner wall of the circular cylindrical body 26. An upper heater 44 is embedded in the inner wall surrounding the upper zone 34, and a middle heater 45 is embedded in the inner wall surrounding the middle zone 35. A lower heater 46 is embedded in the inner wall surrounding the lower zone 36, and a bottom heater 47 is embedded in the lower cover 30. The heaters 44 to 47 are controlled to be held at target temperatures, which are separately set in advance, by a heater controller (not illustrated). The reaction vessel 20 is arranged in such a state that an upper end is positioned in the upper zone 34 and a lower end is positioned in the lower zone 36. In addition, the lower cover 30 is integrated with the cylindrical casing 58.

The pressure controller 40 controls a pressure of the nitrogen gas, which is supplied to the reaction vessel 20, to be held at a preset target pressure.

An example of using the thus-constituted crystal production apparatus 10 according to this embodiment will be described below. First, the underlying substrate 14 is prepared and placed into the growing vessel 12. At that time, the underlying substrate 14 may be arranged to lie in a horizontal or inclined state. Furthermore, metallic gallium and metallic sodium, the latter serving as a flux, are prepared, weighed at a desired mixing molar ratio, and put into the growing vessel 12. The growing vessel 12 is placed into the reaction vessel 20, and the nitrogen gas is fully filled into the electric furnace 24 from the nitrogen bomb 42 via the pressure controller 40. The nitrogen gas is introduced into the reaction vessel 20 through the inlet pipe 22. The reaction vessel 20 is placed on the rotating table 50 to position over a range spanning from the upper zone 34 to the lower zone 36 through the middle zone 35 inside the circular cylindrical body 26 of the electric furnace 24. The lower cover 30 and the upper cover 28 are closed. Then, while rotating the rotating table 50 at a predetermined rotation speed, the pressure of the nitrogen gas in the reaction vessel 20 is controlled to be held at the predetermined level by the pressure controller 40, and the upper heater 44, the middle heater 45, the lower heater 46, and the bottom heater 47 are controlled to be held at the predetermined target temperatures by the heater controller (not illustrated), thereby growing a GaN crystal. The pressure of the nitrogen gas is preferably set to a range of 1 to 7 MPa and more preferably to a range of 2 to 6 MPa. An average temperature of the four heaters is preferably set to a range of 700 to 1000° C. and more preferably to a range of 800 to 900° C. A growth time of the GaN crystal may be set as appropriate depending on the heating temperature and the pressure of the compressed nitrogen gas, and may be set to a range of several hours to several hundred hours, for example.

Figure 4:
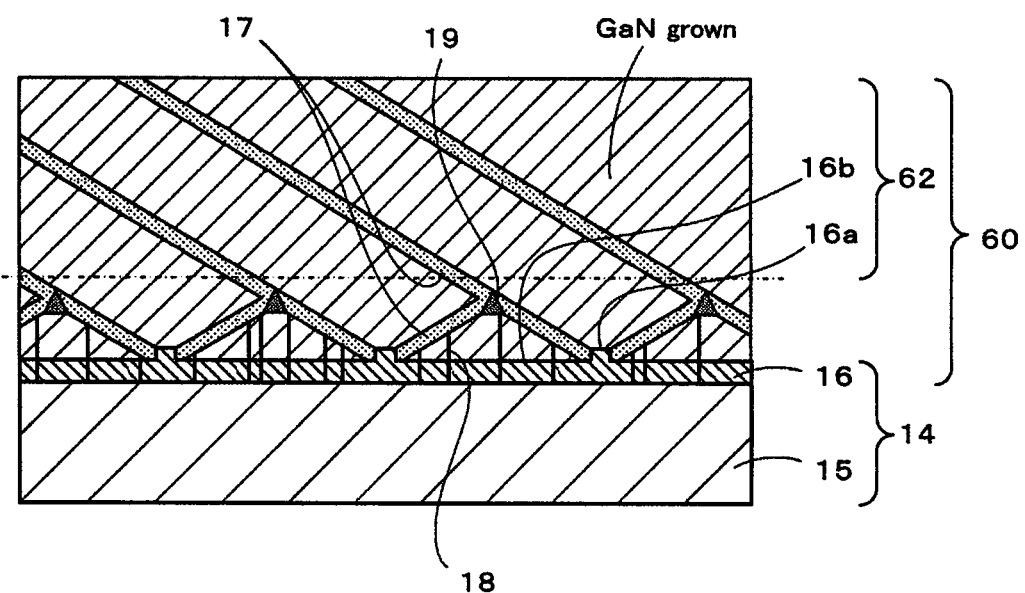
FIG. 4 is a sectional view of GaN grown on the underlying substrate 14.
Figure 5:
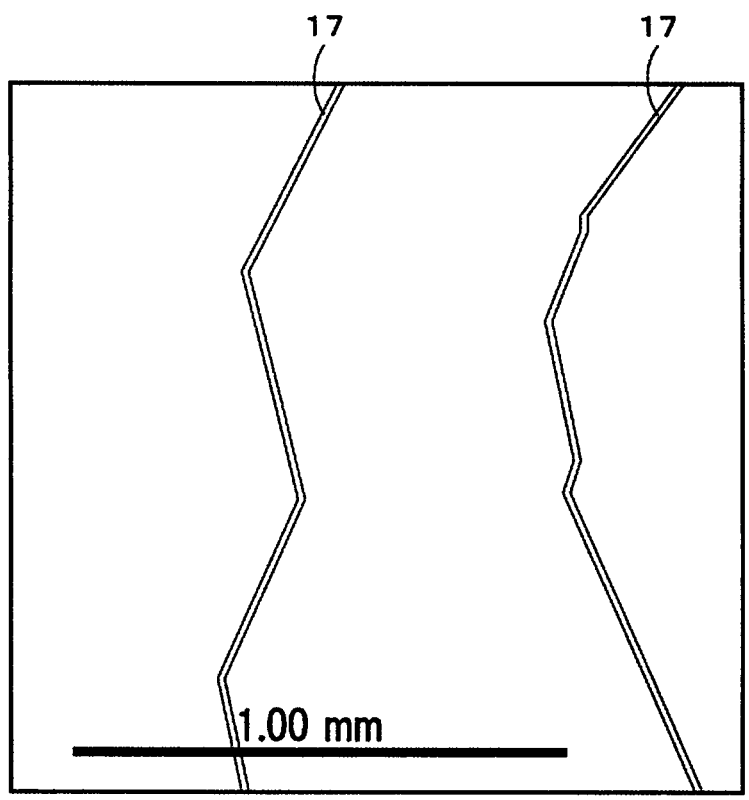
FIG. 5 is a plan view of the GaN grown on the underlying substrate 14.

FIG. 4 is a sectional view of the GaN grown on the seed crystal layer 16 of the underlying substrate 14. On the seed crystal layer 16, the projection 16a is present between the two recesses 16b. When the GaN continues to grow on the seed crystal layer 16, a grain boundary 17 continues to extend, starting from one edge of the projection 16a, obliquely upward so as to cover one of the two recesses 16b. Furthermore, another grain boundary 17 continues to extend, starting from the other edge of the same projection 16a, obliquely upward so as to cover the other of the two recesses 16b. Those extensions of the grain boundaries 17 occur for each of the projections 16a. Therefore, the grain boundaries 17 generating from the adjacent projections 16a collide with each other in the course of the extensions. Although the grain boundaries 17 generated from the projections 16a continue to grow while involving inclusions, voids 19 (involving the inclusions) are formed and the inclusions unspread at points where the grain boundaries 17 collide with each other. Therefore, GaN involving no (or substantially no) inclusions grows in an upper layer portion above the points where the grain boundaries 17 collide with each other. Moreover, the plural voids 19 formed at the points where the grain boundaries 17 collide with each other serve to relax the thermal stress caused by a difference in thermal expansion between the sapphire substrate 15 and the GaN. Thus, the presence of the voids 19 suppresses cracks from being generated in the grown GaN. On the other hand, dislocations 18 involved in the seed crystal layer 16 propagate in a direction (perpendicular (or substantially perpendicular) to the principal surface), which intersects the advancing directions of the grain boundaries 17, and the propagation of the dislocations 18 is stopped by the grain boundaries 17 at the points where the grain boundaries 17 and the dislocations 18 intersect each other. Hence the dislocations 18 do not propagate beyond the grain boundaries 17. As a result, the group 13 nitride crystal having grown on the upper side of the voids 19 has a high quality with fewer amounts of the inclusions, cracks, and dislocations 18. After finishing the growth of the GaN, the sapphire substrate 15 is removed from a GaN substrate 60 by laser liftoff, and the obtained GaN substrate 60 is polished at a surface on the side closer to a seed crystal until the voids 19 disappear (i.e., up to a position denoted by a dashed dotted line in FIG. 4). A GaN substrate 62 after the polishing is given as a uniform (or substantially uniform) GaN substrate free from the inclusions and the cracks. FIG. 5 represents a state resulting from observing an upper surface (i.e., a surface on the side opposite to the seed crystal) of the GaN substrate 62. As illustrated in FIG. 5, the grain boundaries 17 appear in an anfractuous shape on an upper surface of the grown GaN.

According to this embodiment described in detail above, since the seed crystal layer 16 of the underlying substrate 14 has the structure including the projections 16a and the recesses 16b, which are repeatedly present in the stripe shapes, instead of the steps in the stair-like shape as in the related art, the GaN substrate 62 having a high quality can be manufactured by the flux method even in the case of employing the underlying substrate 14 in which the thickness of the seed crystal layer 16 is small.

Needless to say, the present invention is in no way limited to the above embodiment, and the present invention can be implemented in various forms insofar as falling within the technical scope of the invention.

For instance, while the above embodiment uses the underlying substrate 14 in which the edge of the projection 16a is parallel to the a-plane of the hexagonal crystal of GaN, another underlying substrate may be used in which the edge of the projection 16a is parallel to an m-plane of the hexagonal crystal of GaN. However, it is preferable to use the underlying substrate in which the edge of the projection 16a is parallel to the a-plane of the hexagonal crystal of GaN, because an angle of the grain boundary 17 with respect to a c-plane becomes smaller and the thickness of a discarded portion of the GaN substrate 60 is reduced.

EXAMPLES

EXAMPLES of the present invention will be described below. It is to be noted that the present invention is in no way limited by the following EXAMPLES.

Experimental Example 1 Typical Example (Fabrication of Underlying Substrate)

The underlying substrate 14 was fabricated by epitaxially growing GaN into a film having a thickness of 8 μm on the sapphire substrate 15, in which the off-angle was 0.5° in the m-axis direction of the sapphire substrate 15, with a gas-phase method, thus forming the seed crystal layer 16. A recess-projection pattern was formed by dry etching (RIE in this EXAMPLE) in stripe shapes parallel to the a-plane of GaN at a surface of the seed crystal layer 16 of the underlying substrate 14. In the recess-projection pattern, each projection 16a had a level difference (height) ha of 5 μm and a width wa of 15 μm, and each recess 16b had a width wb of 150 μm and a bottom thickness tb of 3 μm.

(Fabrication of GaN Substrate)

The GaN substrate 60 was fabricated by growing a GaN crystal on the seed crystal layer 16 of the underlying substrate 14 with the crystal production apparatus 10 having the structure of a pressure resistant vessel illustrated in FIG. 1. First, by working within a globe box under a nitrogen atmosphere, the underlying substrate 14 was placed at the bottom of an alumina crucible, serving as the growing vessel 12, with the seed crystal layer 16 lying horizontally. Then, 80 g of metallic sodium and 50 g of metallic gallium were put into the crucible, and the crucible was closed with an alumina plate. After setting the crucible into a stainless steel-made inner vessel (not illustrated in FIG. 1), the inner vessel was placed into a stainless steel-made outer vessel, i.e., the reaction vessel 20, capable of accommodating the inner vessel, and the outer vessel was closed with a vessel cover including the inlet pipe 22. The outer vessel was placed on the rotating table 50 installed in a heating region inside the crystal production apparatus 10 that had been subjected to vacuum baking in advance, and the pressure resistant vessel constituted by the circular cylindrical body 26 was tightly closed with a cover. Then, the pressure resistant vessel was evacuated by a vacuum pump to a vacuum level of 0.1 Pa or below. Subsequently, while heating a heating space to a temperature of 870° C. by adjusting the upper heater 44, the middle heater 45, the lower heater 46, and the bottom heater 47, nitrogen gas was introduced from the nitrogen bomb 42 up to 4.0 MPa, and the outer vessel was rotated at a speed of 20 rpm about a center axis clockwise and counterclockwise at a constant period. The rotation was performed under conditions of an acceleration time=12 sec, a holding time=600 sec, a deceleration time=12 sec, and a stop time=0.5 sec. That state was continuously held for 50 hours. After naturally cooling the pressure resistant vessel to the room temperature and returning the internal pressure to the atmospheric pressure, the cover of the pressure resistant vessel was removed, and the crucible was taken out of the pressure resistant vessel. An independent GaN substrate was obtained by removing the solidified metallic sodium in the crucible, recovering the GaN substrate 60 integral with the sapphire substrate 15, and removing the sapphire substrate 15 by laser liftoff. The grown GaN was free from cracks. A front surface and a rear surface of the obtained GaN substrate were polished. A layer with a thickness of about 50 μm involving voids and dislocations was removed at the rear surface (i.e., the surface on the side closer to the seed crystal layer). As a result, the GaN substrate 62 was obtained.

(Evaluation)

Evaluation of GaN Substrate 60 before Polishing

The grain boundaries, the voids, and the inclusions were inspected on the basis of an optical microscope (OM) image, a cathode luminescence (CL) image, and a scanning electron microscope (SEM) image of a cross-section of the GaN substrate 60 before the polishing. As a result, it was proved regarding the GaN substrate 60 of EXPERIMENTAL EXAMPLE 1 that, as illustrated in FIG. 4, each grain boundary 17 extended, starting from the edge of the projection 16a, obliquely upward and formed the void 19 by colliding with another grain boundary 17 facing the relevant grain boundary 17, and that only one of those two grain boundaries 17 extended in an upper layer above the void 19 without involving any inclusions.

Furthermore, whether the GaN substrate 60 before the polishing was fractured and whether internal cracks were present in the GaN substrate 60 were checked visually. As a result, neither fractures nor internal cracks were found in the GaN substrate 60 of EXPERIMENTAL EXAMPLE 1.

Evaluation of GaN Substrate 62 after Polishing

On the GaN substrate 62 after the polishing, a dislocation density was measured using a SEM equipped with a CL observation detector. When observing CL of the GaN substrate 62, dislocation points are observed as black points (dark spots) because the dislocation points generate no luminescence. The dislocation density is calculated by measuring a density of the dark spots. As a result of observing a 100 μm square region of the GaN substrate 62 of EXPERIMENTAL EXAMPLE 1, no dark spots were observed in both regions above the projections 16a and the recesses 16b of the underlying substrate 14, and it was found that the dislocation density was less than $1 \times 10^4/cm^2$.

Moreover, uniformity was inspected by observing the GaN substrate 62 after the polishing with a reflected-illumination optical microscope. Observation with the reflected-illumination optical microscope generally results in that a portion involving the inclusion looks bright. The GaN substrate 62 of EXPERIMENTAL EXAMPLE 1 was determined to be in a uniform state of involving no inclusions because the portion looking bright was not found.

From the evaluation results described above, overall evaluation for the GaN substrate 62 of EXPERIMENTAL EXAMPLE 1 was rated as "very good" (⊙). Table 1 lists the sizes of the projection-recess pattern of the underlying substrate 14 and the evaluations results of the GaN substrates 60 and 62 in EXPERIMENTAL EXAMPLE 1.

TABLE 1

| Example | Level difference of projection, ha (μm) | Width of projection, wa (μm) | Bottom thickness of recess, tb (μm) | Width of recess, wb (μm) | Off-angle θg (°) | Grain Boundary | Void | Crack Internal | Crack Fracture | GaN substrate before polishing Dislocation density Region above projection (/cm²) | GaN substrate before polishing Dislocation density Region above recess (/cm²) | Uniformity[X.1] | Overall evaluation[X.2] |
|---|---|---|---|---|---|---|---|---|---|---|---|---|---|
| 1 | 5 | 15 | 3 | 150 | 0.6 | Observed | Observed | Non | — | <1.00E+04 | <1.00E+04 | Uniform | ⊚ |
| 2 | 0.1 | 15 | 3 | 150 | 0.6 | Non | Non | — | Observed | 5.00E+06 | 5.00E+06 | Uniform | × |
| 3 | 0.3 | 15 | 3 | 150 | 0.6 | Observed | Observed | Observed | Non | <1.00E+04 | <1.00E+04 | Uniform | ○ |
| 4 | 0.5 | 15 | 3 | 150 | 0.6 | Observed | Observed | Non | Non | <1.00E+04 | <1.00E+04 | Uniform | ⊚ |
| 5 | 10 | 15 | 3 | 150 | 0.6 | Observed | Observed | non | Non | <1.00E+04 | <1.00E+04 | Uniform | ⊚ |
| 6 | 40 | 15 | 3 | 150 | 0.6 | Observed | Observed | Observed | Non | <1.00E+04 | <1.00E+04 | Uniform | ○ |
| 7 | 50 | 15 | 3 | 150 | 0.6 | Observed | Observed | — | Observed | <1.00E+04 | <1.00E+04 | Ununiform | × |
| 8 | 5 | 3 | 3 | 150 | 0.6 | Non | Non | — | Observed | 5.00E+06 | 5.00E+06 | Uniform | × |
| 9 | 5 | 5 | 3 | 150 | 0.6 | Observed (partially) | Observed (partially) | Observed | Non | <1.00E+04 | <1.00E+04 | Uniform | ○ |
| 10 | 5 | 10 | 3 | 150 | 0.6 | Observed | Observed | Non | Non | <1.00E+04 | <1.00E+04 | Uniform | ⊚ |
| 11 | 5 | 50 | 3 | 150 | 0.6 | Observed | Observed | Non | Non | <1.00E+04 | <1.00E+04 | Uniform | ⊚ |
| 12 | 5 | 100 | 3 | 150 | 0.6 | Observed | Observed | Non | Non | 1.00E+06 | <1.00E+04 | Uniform | ○ |
| 13 | 5 | 120 | 3 | 150 | 0.6 | Observed | Observed | — | Observed | 4.00E+06 | <1.00E+04 | Uniform | × |
| 14 | 5 | 15 | 40 | 150 | 0.6 | Observed | Observed | Non | Non | <1.00E+04 | <1.00E+04 | Uniform | ⊚ |
| 15 | 5 | 15 | 2 | 150 | 0.6 | Observed | Observed | Non | Non | <1.00E+04 | <1.00E+04 | Uniform | ⊚ |
| 16 | 5 | 15 | 1.5 | 150 | 0.6 | — | — | — | — | — | — | — | × |
| 17 | 5 | 15 | 3 | 40 | 0.6 | Observed | Non | — | Observed | <1.00E+04 | <1.00E+04 | Ununiform | × |
| 18 | 5 | 15 | 3 | 50 | 0.6 | Observed | Observed (partially) | Observed | Non | <1.00E+04 | <1.00E+04 | Somewhat uniform | ○ |
| 19 | 5 | 15 | 3 | 100 | 0.6 | Observed | Observed | Non | Non | <1.00E+04 | <1.00E+04 | Uniform | ⊚ |
| 20 | 5 | 15 | 3 | 250 | 0.6 | Observed | Observed | Non | Non | <1.00E+04 | <1.00E+04 | Uniform | ⊚ |
| 21 | 5 | 15 | 3 | 500 | 0.6 | Observed | Observed | Observed | Non | <1.00E+04 | <1.00E+04 | Uniform | ○ |
| 22 | 5 | 15 | 3 | 520 | 0.6 | Observed | Observed | — | Observed | <1.00E+04 | <1.00E+04 | Ununiform | × |
| 23 | 5 | 15 | 3 | 150 | 0.24 | Observed | Observed | Observed | Non | <1.00E+04 | <1.00E+04 | Uniform | ○ |
| 24 | 5 | 15 | 3 | 150 | 0.36 | Observed | Observed | Non | Non | <1.00E+04 | <1.00E+04 | Uniform | ⊚ |
| 25 | 5 | 15 | 3 | 150 | 1.2 | Observed | Observed | Non | Non | <1.00E+04 | <1.00E+04 | Uniform | ⊚ |
| 26 | 5 | 15 | 3 | 150 | 2.4 | Observed | Observed | Observed | Non | <1.00E+04 | <1.00E+04 | Uniform | ○ |

[X.1]Uniformity: Uniform = No inclusions, Somewhat uniform = Substantially no inclusions, Ununiform = With inclusions
[X.2]Evaluation: ⊚ = Very good, ○ = Good, × = Bad Examples 2 to 7

Fabrication of the underlying substrates and fabrication and evaluation of the GaN substrates were performed in similar manners to those in EXPERIMENTAL EXAMPLE 1 except for setting the level difference ha of the projection 16a as listed in Table 1. The obtained results are also listed in Table 1. As seen from Table 1, when the level difference ha of the projection 16a was in a range of 0.3 to 40 μm, the GaN substrates 62 having a high quality were obtained (EXPERIMENTAL EXAMPLES 3 to 6). At a lower limit of the above range, although the voids were partly not generated and the internal cracks were generated, the GaN substrate 62 having a high quality was obtained in which the dislocation density was low and no inclusions were found in regions other than points of the internal cracks (EXPERIMENTAL EXAMPLE 3). At an upper limit of the above range, although the voids were somewhat large and the internal cracks were generated from the voids, the GaN substrate 62 having a high quality was obtained in which the dislocation density was low and no inclusions were found in regions other than points of the internal cracks (EXPERIMENTAL EXAMPLE 6). When the level difference ha of the projection 16a was in a range of 0.5 to 10 μm, the GaN substrates 62 having a high quality were obtained in which the dislocation density was low and neither the cracks nor the inclusions were found (EXPERIMENTAL EXAMPLES 1, 4 and 5). On the other hand, when the level difference exceeded below the lower limit, the dislocation density was entirely not reduced because the grain boundaries were not generated, and a stress relaxation effect was not obtained because the voids were also not generated, whereby the GaN substrate was fractured (EXPERIMENTAL EXAMPLE 2). When the level difference exceeded above the upper limit, the voids remained in the upper layer portion, and the GaN substrate 60 was fractured starting from those voids (EXPERIMENTAL EXAMPLE 7).

Experimental Examples 8 to 13

Fabrication of the underlying substrates and fabrication and evaluation of the GaN substrates were performed in similar manners to those in EXPERIMENTAL EXAMPLE 1 except for setting the width wa of the projection 16a as listed in Table 1. The obtained results are also listed in Table 1. As seen from Table 1, when the width wa of the projection 16a was in a range of 5 to 100 μm, the GaN substrates 62 having a high quality were obtained (EXPERIMENTAL EXAMPLES 9 to 12). At a lower limit of the above range, although the grain boundaries and the voids were partly not generated and the internal cracks were generated because the projections 16a partly disappeared due to melt-back, the GaN substrate 62 having a high quality was obtained in which the dislocation density was low and no inclusions were found in regions other than points of the internal cracks (EXPERIMENTAL EXAMPLE 9). At an upper limit of the above range, although the dislocation density was not substantially zero in regions above the projections 16a because the width wa of the projection 16a was large, the GaN substrate 62 having a high quality was obtained in which the dislocation density was comparatively low and no inclusions were found (EXPERIMENTAL EXAMPLE 12). When the width wa of the projection 16a was in a range of 10 to 50 µm, the GaN substrates 62 having a high quality was obtained in which the dislocation density was low and neither the cracks nor the inclusions were found (EXPERIMENTAL EXAMPLES 1, 10 and 11). On the other hand, when the projection width was below the lower limit, the dislocation density was entirely not reduced because the projections disappeared due to melt-back in the middle of processing and the grain boundaries were not generated, and the stress relaxation effect was not obtained because the voids were also not generated, whereby the GaN substrate 60 was fractured (EXPERIMENTAL EXAMPLE 8). When the projection width exceeded above the upper limit, the grain boundaries were generated, but the dislocation density was not reduced in the regions above the projections 16a because the projections 16a were too wide. In addition, the voids were generated, but the stress relaxation effect was insufficient because a distribution density of the voids was low. Hence the GaN substrate 60 was fractured (EXPERIMENTAL EXAMPLE 13). Even in the case of the width wa of the projection 16a being over 100 µm as in EXPERIMENTAL EXAMPLE 13, by increasing a thickness of the grown GaN to such an extent that the grain boundaries 17 (i.e., each grain boundary 17 after colliding with the adjacent grain boundary 17) obliquely intersect right above the projection 16a, propagation of the dislocations extending upward from upper surfaces of the projections 16a is stopped by those grain boundaries 17, and the dislocations do not further propagate above the grain boundaries 17 colliding with each other. In that case, although the surface of the GaN substrate on the side closer to the seed crystal layer has to be polished in a larger amount, the GaN substrate after the polishing is obtained in high quality.

Experimental Examples 14 to 16

Fabrication of the underlying substrates and fabrication and evaluation of the GaN substrates were performed in similar manners to those in EXPERIMENTAL EXAMPLE 1 except for setting the bottom thickness tb of the recess 16b as listed in Table 1. The obtained results are also listed in Table 1. As seen from Table 1, when the bottom thickness tb of the recess 16b was 2 µm or more, the GaN substrates 62 having high quality were obtained in which the dislocation density was low and neither the cracks nor the inclusions were found (EXPERIMENTAL EXAMPLES 1, 14 and 15). On the other hand, when the bottom thickness tb of the recess 16b was lower than 2 µm, the seed crystal layer 16 disappeared due to melt-back in the middle of the processing, and no GaN crystals were grown (EXPERIMENTAL EXAMPLE 16).

Experimental Examples 17 to 22

Fabrication of the underlying substrates and fabrication and evaluation of the GaN substrates were performed in similar manners to those in EXPERIMENTAL EXAMPLE 1 except for setting the width wb of the recess 16b as listed in Table 1. The obtained results are also listed in Table 1. As seen from Table 1, when the width wb of the recess 16b was in a range of 50 to 500 µm, the GaN substrates 62 having high quality were obtained (EXPERIMENTAL EXAMPLES 18 to 21). At a lower limit of the above range, the voids were just partly generated, the internal cracks were generated, and some inclusions were found partly in the upper layer portion. However, the GaN substrate 62 having high quality was obtained in which the dislocation density was low in regions other than points of the internal cracks and the inclusions (EXPERIMENTAL EXAMPLE 18). At an upper limit of the above range, although the internal cracks were generated because the distribution density of the voids was somewhat small, the GaN substrate 62 having high quality was obtained in which the dislocation density was low and no inclusions were found in regions other than points of the internal cracks (EXPERIMENTAL EXAMPLE 21). When the width wb of the recess 16b was in a range of 100 to 250 µm, the GaN substrates 62 having high quality were obtained in which the dislocation density was low and neither the cracks nor the inclusions were found (EXPERIMENTAL EXAMPLES 1, 19 and 20). On the other hand, when the recess width exceeded below the lower limit (EXPERIMENTAL EXAMPLE 17), the stress relaxation effect was not obtained because the voids were not generated well, whereby the GaN substrate 60 was fractured. Moreover, many grain boundaries involving the inclusions remained in the upper layer portion. When the recess width exceeded above the upper limit (EXPERIMENTAL EXAMPLE 22), the distribution density of the voids was low and void sizes were increased, whereby the GaN substrate 60 was fractured. Moreover, many inclusions remained in the upper layer portion.

Experimental Examples 23 to 26

Fabrication of the underlying substrates and fabrication and evaluation of the GaN substrates were performed in similar manners to those in EXPERIMENTAL EXAMPLE 1 except for setting the off-angle θg in the a-axis direction of the seed crystal layer 16 of GaN as listed in Table 1. The obtained results are also listed in Table 1. The off-angle θg is a value obtained by converting the off-angle θs of the sapphire substrate 15 on the basis of the known relational expression (θg≈1.2θs). As seen from Table 1, when the off-angle θg in the a-axis direction is 0.24 to 2.4°, the GaN substrates 62 having high quality were obtained. At a lower limit of the above range, although the voids remained partly in the upper layer portion and the internal cracks were generated starting from the remained voids, the GaN substrate 62 having high quality was obtained in which the dislocation density was low and no inclusions were found in regions other than points of the internal cracks (EXPERIMENTAL EXAMPLE 23). At an upper limit of the above range, although the voids were generated together with the grain boundaries 17 starting from points other than the projections 16a and the internal cracks were generated, the GaN substrate 62 having high quality was obtained in which the dislocation density was low and no inclusions were found in regions other than points of the internal cracks (EXPERIMENTAL EXAMPLE 26). When the off-angle θg was in a range of 0.36 to 1.2°, the GaN substrates 62 having high quality were obtained in which the dislocation density was low and neither the cracks nor the inclusions were found (EXPERIMENTAL EXAMPLES 1, 24 and 25).

It was confirmed that the GaN substrates 62 obtained in EXPERIMENTAL EXAMPLES emitted broad fluorescence (blue fluorescence) having a peak in 440 to 470 nm when they were illuminated with light in wavelength of 330 to 385 nm (e.g., light of a hydrogen lamp). In general, a GaN crystal produced by the flux method emits blue light when it is illuminated with light of the above-mentioned wavelength. On the other hand, a GaN crystal produced by the gas-phase method emits yellow fluorescence when illuminated with the similar light. Accordingly, whether a crystal has been produced by the flux method or the gas-phase method can be distinguished depending on the color of fluorescence emitted when the crystal is illuminated with light of the above-mentioned wavelength.

It is to be noted that EXPERIMENTAL EXAMPLES 1, 3 to 6, 9 to 12, 14, 15, 18 to 21, and 23 to 26 correspond to EXAMPLES of the present invention, and that the remaining EXPERIMENTAL EXAMPLES correspond to COMPARATIVE EXAMPLES.

What is claimed is:

1. An underlying substrate including a seed crystal layer of a group 13 nitride,
    wherein projections and recesses repeatedly appear in stripe shapes at a principal surface of the seed crystal layer,
    the projections have a level difference of 0.5 to 10 µm and a width of 10 to 50 µm, and the recesses have a bottom thickness of 2 µm or more and a width of 100 to 250 µm,
    an off-angle formed by a normal line of the principal surface of the seed crystal layer and a c-axis of the seed crystal layer is 0.36 to 1.2° in an a-axis direction of the group 13 nitride, and
    surfaces of the projections are not masked and the group 13 nitride is exposed.

2. The underlying substrate according to claim 1, wherein edges of the projections are parallel to an a-plane of a group 13 nitride crystal.

3. The underlying substrate according to claim 1, wherein the bottom thickness of the recesses is 2 to 40 µm.

4. A method of manufacturing the underlying substrate according to claim 1,
    wherein the underlying substrate is obtained by epitaxially growing a group 13 nitride crystal into a film on a sapphire substrate with a gas-phase method, the group 13 nitride crystal constituting the seed crystal layer, and by patterning a principal surface of the seed crystal layer such that projections and recesses repeatedly appear in stripe shapes at the principal surface.

5. A method of producing a group 13 nitride crystal,
    wherein the group 13 nitride crystal is grown on the seed crystal layer by placing the underlying substrate according to claim 1 in a vessel together with a group 13 metal and metallic sodium, and by heating the vessel to 700 to 1000° C. while nitrogen is introduced to the vessel.

* * * * *